(12) United States Patent
Maeda et al.

(10) Patent No.: US 7,828,898 B2
(45) Date of Patent: Nov. 9, 2010

(54) CVD APPARATUS OF IMPROVED IN-PLANE UNIFORMITY

(75) Inventors: Tadashi Maeda, Hyogo (JP); Keisuke Hichijoh, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 304 days.

(21) Appl. No.: 11/521,216

(22) Filed: Sep. 13, 2006

(65) Prior Publication Data

US 2007/0062448 A1 Mar. 22, 2007

(30) Foreign Application Priority Data

Sep. 15, 2005 (JP) ............................... 2005-267892

(51) Int. Cl.
*C23C 16/455* (2006.01)
(52) U.S. Cl. ...................................... 118/715; 118/724
(58) Field of Classification Search ................. 118/715, 118/724
See application file for complete search history.

(56) References Cited

U.S. PATENT DOCUMENTS

| | | | | | |
|---|---|---|---|---|---|
| 4,249,970 | A | * | 2/1981 | Briska et al. ................. | 438/563 |
| 4,605,947 | A | * | 8/1986 | Price et al. .................... | 257/388 |
| 5,118,642 | A | * | 6/1992 | Yoshino et al. .............. | 117/101 |
| 6,074,486 | A | * | 6/2000 | Yang et al. ................... | 118/719 |
| 6,142,773 | A | * | 11/2000 | Shimazu ...................... | 432/241 |
| 6,692,575 | B1 | * | 2/2004 | Omstead et al. ............. | 118/728 |
| 6,797,108 | B2 | * | 9/2004 | Wendling .............. | 156/345.33 |
| 2003/0231698 | A1 | * | 12/2003 | Yamaguchi et al. .......... | 374/179 |
| 2004/0061210 | A1 | * | 4/2004 | Loo ............................. | 257/684 |
| 2004/0115584 | A1 | * | 6/2004 | Okabe ......................... | 432/200 |
| 2005/0170669 | A1 | * | 8/2005 | Okumura et al. ............. | 438/795 |
| 2006/0102287 | A1 | * | 5/2006 | Grant ..................... | 156/345.51 |

FOREIGN PATENT DOCUMENTS

| | | | |
|---|---|---|---|
| JP | 01-251725 | * | 10/1989 |
| JP | 6-42474 | | 6/1994 |
| JP | 2002-267782 | | 9/2002 |
| WO | WO 2004075272 | * | 9/2004 |

* cited by examiner

*Primary Examiner*—Ram N Kackar
*Assistant Examiner*—Satish Chandra
(74) *Attorney, Agent, or Firm*—Cooper & Dunham LLP

(57) ABSTRACT

A CVD apparatus includes a vertical boat extending in a vertical direction and capable of holding plural substrates in a horizontal state such that the substrates are aligned in the vertical direction, an inner tube extending in the vertical direction and provided so as to surround the boat laterally, an outer tube surrounding the inner tube laterally from outside, the outer tube further covering a top part of the inner tube, a flange holding the inner tube and outer tube at respective bottom ends thereof, gas introducing nozzles provided on a flange sidewall at two locations thereof, the gas introducing nozzles introducing gases from outside to an interior of the inner tube at respective gas ejection ports, and a gas evacuation part evacuating a gas in the outer tube to outside thereof, wherein there is provided a guide part in the vicinity of the gas ejection ports of the gas introducing nozzles such that the gases ejected from the respective gas ejection ports are caused to flow generally parallel to a bottom surface of the flange along an inner surface of the flange sidewall.

13 Claims, 8 Drawing Sheets

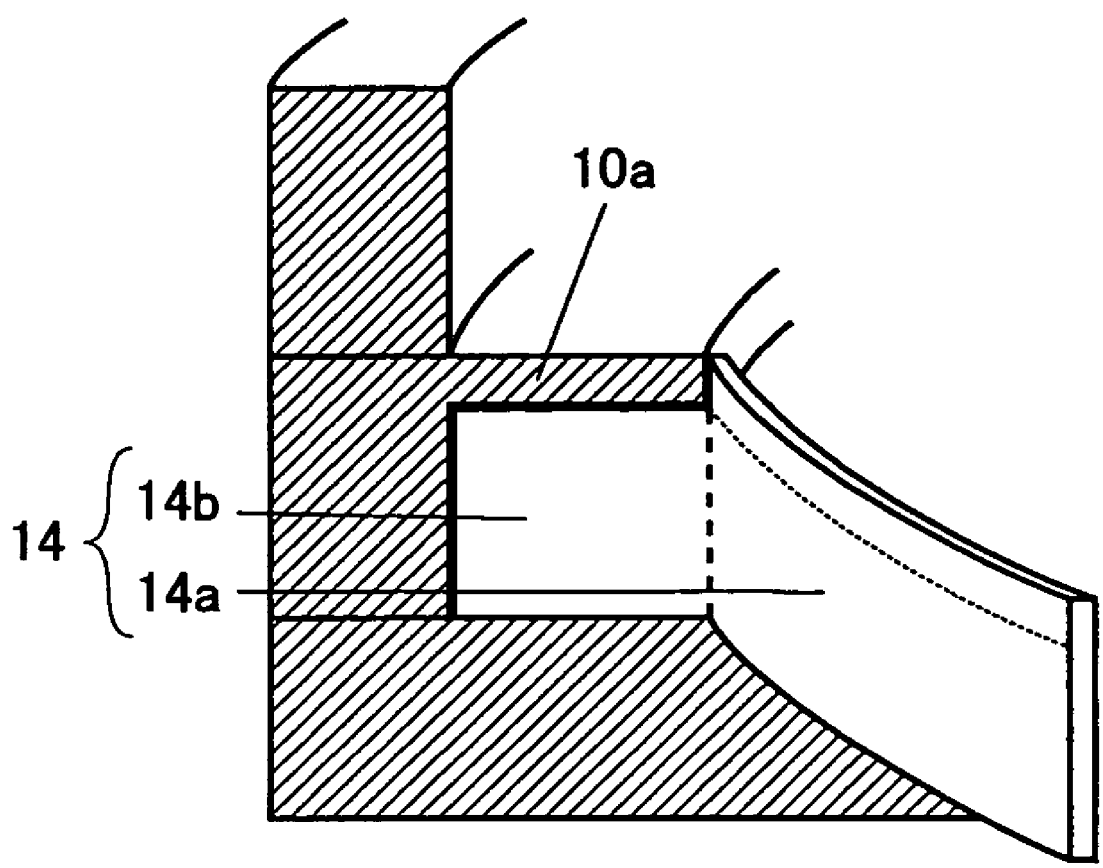

CVD APPARATUS OF IMPROVED IN-PLANE UNIFORMITY

BACKGROUND

This disclosure generally relates to a CVD (chemical vapor deposition) apparatus used for forming a film such as a silicon oxide film or a silicon nitride film on a substrate held on a boat at elevated temperatures in a processing space filled with a gas mixture of two gases of different kinds, such as a silane family gas and an $N_2O$ gas, under a reduced pressure environment.

First, a low-pressure CVD apparatus (referred to hereinafter as LPCVD) according to a related art of the present invention will be explained.

FIGS. 8A and 8B shows an example of a CVD apparatus according to a related art, wherein FIG. 8A shows the overall construction of the CVD apparatus, while FIG. 8B shows the CVD apparatus in an enlarged cross-sectional view taken along a line C-C' of FIG. 8B.

Referring to FIGS. 8A and 8B, the CVD apparatus includes, at a central part thereof, a boat 104 for holding substrates 102, which may be a semiconductor substrate, on which film formation is to be made. The boat 104 is supported on a flange 110 having a circular shape in a plan view, and thus, the bottom part of the boat 104 is supported on the flange 110.

Further, an inner tube 106 of cylindrical shape is disposed so as to surround the boat 104, wherein the inner tube 106 is held by an inner tube holding part 110a of the flange 110 provided for holding the inner tube 106. Here, the inner tube holder part 110a is a plate-like member projecting from the inner surface of the flange sidewall inward with a predetermined separation from the bottom surface of the flange 110.

Further, there is disposed an outer tube 108 at the outside of the inner tube 106 so as to enclose the inner tube 106 entirely, wherein the outer tube 108 is held by an outer tube holding part 110b of the flange 110.

Further, there are provided two gas introducing nozzles 132a and 132b on the flange sidewall at a height between the bottom surface of the flange 110 and the inner tube holding part 110a of the flange 110, wherein the gas introducing nozzles 132a and 132b are provided respectively for introducing a silane gas and an $N_2O$ gas into the inner tube 106. Thereby, the as introducing nozzles 132a and 132b are provided such that respective gas ejection ports protrude inward from the inner surface of the flange sidewall, in other words, the inner surface of the sidewall of the flange 110, with a distance of about several centimeters.

Further, there is provided a gas evacuation port 116 on the flange sidewall in the part between the inner tube holder part 110a and the outer tube holder part 110b, wherein the gas evacuation port 16 is connected to a pump (not illustrated), and the gas inside the outer tube 108 is evacuated therefrom through the gas evacuation port 116 by the pump.

With the CVD apparatus of FIGS. 8A and 8B, two gases ejected respectively from the gas introducing nozzles 132a and 132b are mixed with each other inside the inner tube 106 and film formation is conducted on the surface of the substrates 102.

More specifically, the gases introduced from the gas introducing parts 132a and 132b reach a substrate 102 held in the boat 104 at the bottom part thereof and moves through the inner tube 106 in the upward direction. The gas reached the top part of the inner tube 106 is then evacuated from the gas evacuation port 116 to the outside of the apparatus by the pump after flowing through the space between the inner tube 106 and the outer tube 108.

With this CVD apparatus, it should be noted that the gas introducing nozzles 132a and 132b are disposed so as to project for a distance of several centimeters from the inner surface of the flange sidewall toward the central part of the flange 110 for facilitating mixing of the two gases thus introduced therefrom.

Further, as shown in FIG. 9, there is proposed a construction in the related art in which an L-shaped gas introducing nozzle 134 is provided such that the gas ejection port of the nozzle 134 points upward to the ceiling of the outer tube 108. With this construction, the gases are injected in the upward direction for facilitating mixing of the two gases. Reference should be made to Patent Reference 1, for example.

With such CVD apparatuses of FIGS. 8A and 8B, however, there remains the problem that mixing of the gases tends to become poor and non-uniform in the vertical direction, and thus, there has been the need of providing a temperature gradient in the vertical direction along the boat 104.

In order to attend to the foregoing problem and to facilitate mixing of the two gases, there is a proposal to provide four nozzles for the gas introducing nozzles, such that two of the gas introducing nozzles are provided so as to project from the inner surface of the flange sidewall with a distance of several centimeters and such that the remaining two gas introducing nozzles are formed to have the L-shaped form pointing the ceiling of the outer tube. Thereby, the parts pointing the ceiling of the outer tube extend to the top part of the boat and the gas ejection port is formed at a level corresponding to the top part of the boat. Reference should be made to Patent Reference 1, for example.

With the CVD apparatus shown in Patent Reference 1, on the other hand, the two nozzles projecting from the sidewall surfaces of the flange toward the flange central part are used solely for the film formation on the substrates placed in the lower part of the boat, while the L-shaped nozzles are used solely for the film formation on the substrates placed in the upper part of the boat.

PATENT REFERENCE 1 Japanese Laid-Open Patent Application 1-251725

In such a LPCVD apparatus of such vertical type, it is generally easy to carry out film formation on the substrate surface with an in-plane uniformity of 3% or less in terms of film thickness. On the other hand, in the case of forming an oxide film on a substrate surface by mixing a silane family gas and an $N_2O$ gas, it has been difficult to attain the in-plane uniformity of smaller than 5% because of poor gas mixing at the bottom part of the boat.

Because Patent Reference 1 has the main objective of attaining uniformity of film thickness between the top part of the boat and the bottom part of the boat, the LPCVD apparatus uses the same nozzles that are used in the conventional LPCVD apparatus of vertical type at the bottom part of the boat. Thus, even when there is provided improvement to use the L-shaped nozzles, the in-plane uniformity of film thickness is not improved for the substrates placed at the bottom part of the boat.

Because there are cases in which the films thus formed by the CVD process are used for capacitor elements, there arises a problem that the variation of film thickness and film quality affects directly on the performance of the capacitor element in terms of the variation of the capacitance value.

SUMMARY

There is provide in this disclosure an approach to improve the uniformity of the films formed on the substrates disposed at the lowermost part of the boat with regard to the film thickness and film quality, for stable and reliable production of semiconductor products. That is, there is provide an approach to improve, in a vertical CVD apparatus, in-plane uniformity of a film formed on a substrate.

According to a first aspect, there is provided a CVD apparatus, comprising:

a vertical boat extending in a vertical direction and capable of holding plural substrates in a horizontal state such that said substrates are aligned in the vertical direction;

an inner tube extending in said vertical direction and provided so as to surround said boat laterally;

an outer tube surrounding said inner tube laterally from outside, said outer tube further covering a top part of said inner tube;

a flange holding said inner tube and outer tube at respective bottom ends thereof;

gas introducing nozzles provided on a flange sidewall at two locations thereof, said gas introducing nozzles introducing gases from outside to an interior of said inner tube at respective gas ejection ports; and a gas evacuation part evacuating a gas in said outer tube to outside thereof;

wherein there is provided a guide part in the vicinity of said gas ejection ports of said gas introducing nozzles such that said gases ejected from said respective gas ejection ports are caused to flow generally parallel to a bottom surface of said flange along an inner surface of said flange sidewall.

Because the guide part is provided in the vicinity of the gas introducing nozzles with the above-mentioned CVD apparatus, the two gases introduced from the respective gas introducing nozzles are mixed thoroughly with each other as they are caused to flow in the direction generally parallel to the bottom surface of the flange along the inner surface of the flange sidewall.

In a preferred embodiment, the guide part includes two rectangular surfaces sharing respective edges with each other, one of the rectangular surfaces being disposed generally parallel to the inner surface of the flange sidewall, the other of the rectangular surfaces being disposed generally perpendicular to the inner surface of the flange sidewall The approach provided in this disclosure enables one to form a guide structure of the gas mixture with low cost. For example, such a guide structure may be formed by using a stainless steel plate bent in an L-shaped form.

Here, "rectangular surface" includes, in addition to a plate of a rectangular shape, other plates such as a plate having a curved edge surface, as long it can provide a similar effect when used in place of the plate of the rectangular shape.

In a further preferred embodiment, the flange comprises a projecting plate projecting from the inner surface of the flange sidewall in a direction toward a central part of the flange in a part thereof where at least the guide part is provided, the projecting plate, a bottom surface of the flange inside the flange sidewall, the inner surface of the sidewall and the guide part forming together a mixing space for mixing the gases to form a mixed gas, the mixing space further causing to flow the mixed gas along the inner surface of the sidewall surface.

By forming the mixing space by the projecting plate, the bottom surface of the flange inside the sidewall, the inner surface of the flange sidewall and the guide part, it becomes possible to achieve more reliable mixing of the gases.

In a further preferred embodiment, the projecting plate forms a holder holding the inner tube.

By using the projecting plate for the holder holding the inner tube, it becomes possible to form the flow path along the inner surface of the flange sidewall with a simple construction.

In a further preferred embodiment, the guide part comprises a conduit connected to the respective gas ejection ports of the gas introducing nozzles so as to merge the gases ejected from the respective ejection ports. Thereby, the gases are mixed with each other to form a mixed gas and are ejected in the direction generally parallel to the bottom surface of the flange along the inner surface of the flange sidewall.

In a further preferred embodiment, the gas introducing nozzles introduce a silane family gas and an $N_2O$ gas to the interior of the inner tube respectively. Here, the silane family gas includes any of monosilane, disilane, dichlorosilane, and the like.

In conventional CVD apparatuses, it has been difficult to mix such silane family gas with an $N_2O$ gas, and because of this, it has been difficult to attain satisfactory in-plane uniformity for the film formed with these gases in terms of film thickness and film quality.

With the above-mentioned CVD apparatus, it is possible to supply a thoroughly mixed gas of the silane family gas and the $N_2O$ gas to the entire surface of the substrates, and thus, it becomes possible to cause the CVD reaction more efficiently and uniformly as compared with the conventional CVD apparatus. Thereby, it becomes possible to improve the uniformity of the film formed by using the silane family gas and the $N_2O$ gas in terms of film thickness and film quality.

In the case of using the silane family gas and the $N_2O$ gas, it is preferable that the gas introducing nozzles are provided at a same height as measured from a bottom surface of the flange. Further, it is preferable that one of the gas introducing nozzles located at an upstream side with regard to the other of the gas introducing nozzles in a direction of a flow of the mixed gas along the inner surface, is used to introduce the $N_2O$ gas, and the other gas introducing nozzle is used to introduce the silane family gas.

In the case of using a mixture of silane family gas and an $N_2O$ gas in an LPCVD apparatus, it is generally accepted that use of a mixing ratio of 1:40-1:60 (silane gas:$N_2O$ gas ratio) is preferable in terms flow rate ratio. With such a flow rate ratio, the silane family gas is supplied only with a small amount as compared with the $N_2O$ gas, and thus, it is preferable to introduce the silane family gas from the gas introducing nozzle provided in the downstream side of the gas flow path formed along the inner wall of the flange sidewall and to introduce the $N_2O$ gas from the gas introducing nozzle provided at the upstream side of the gas flow direction, in view of the fact that the gas introducing nozzle at the upstream side introduces the $N_2O$ gas with an overwhelming flow rate as compared with the silane family gas. With such a construction, the silane family gas is carried by the $N_2O$ gas and efficient mixing takes place between the silane gas and the $N_2O$ gas as the silane gas is carried by the $N_2O$ gas of large flow rate.

In a second aspect of this disclosure, there is provided a CVD apparatus, comprising:

a vertical boat extending in a vertical direction and capable of holding plural substrates in a horizontal state such that said substrates are aligned in the vertical direction;

an inner tube extending in said vertical direction and provided so as to surround said boat laterally;

an outer tube surrounding said inner tube laterally from outside, said outer tube further coveting a top part of said inner tube;

a flange holding said inner tube and outer tube at respective bottom ends thereof;

a gas introducing nozzle provided on a flange sidewall, said gas introducing nozzle introducing a gas from outside to an interior of said inner tube at a gas ejection port;

a gas evacuation part evacuating a gas in said outer tube to outside thereof;

a mixed gas supplying part provided outside said flange, said mixed gas supplying part comprising: two gas supplying paths respectively supplying different gases therethrough; a mixing part merging said two gas supplying paths with each other, said mixing part mixing said gases supplied from said respective gas supplying paths to form a mixed gas; and a single gas flow path supplying said mixed gas to one of said gas introducing nozzles connected thereto; and a guide part provided in the vicinity of said gas ejection port of said gas introducing nozzle such that said mixed gas ejected from said gas ejection port is caused to flow generally parallel to a bottom surface of said flange along an inner surface of said flange sidewall.

According to the second aspect, in which the two gases are pre-mixed before being introduced into the CVD apparatus, it becomes possible to supply a thoroughly mixed gas to the surface of the substrates with reliability.

In a preferred embodiment of the second aspect, the guide part includes two rectangular surfaces sharing respective edges with each other, one of the rectangular surfaces being disposed generally parallel to the inner surface of the sidewall, the other of the rectangular surfaces being disposed generally perpendicular to the inner surface of said sidewall The approach of this disclosure enables one to form the guide part with low cost. For example, such a guide part may be formed by using a stainless steel plate bent in an L-shaped form.

In a further preferred embodiment of the second aspect, the flange further comprises a projecting plate projecting from the inner surface of the flange sidewall in a direction toward a central part of the flange in a part thereof where at least the guide part is provided, the projecting plate, a bottom surface of the flange inside the flange sidewall, the inner surface of the flange sidewall and the guide part forming together a flow deflection part for causing the mixed to flow gas along the inner surface of the sidewall surface.

In this case too, it is possible to use the inner tube holding part holding the inner tube for the projecting plate.

Further, in the second aspect of this disclosure, the guide part may comprise a conduit connected to the gas ejection port of the gas introducing nozzle, the conduit discharging the mixed gas in the direction generally parallel to the bottom surface of the flange along the inner surface of the sidewall.

Further, the gas introducing nozzle may introduce a mixture of a silane family gas and an $N_2O$ gas to the interior of the inner tube as the mixed gas also in this second aspect.

According to the first aspect of this disclosure, in which the CVD apparatus comprises a vertical boat extending in a vertical direction and capable of holding plural substrates in a horizontal state such that said substrates are aligned in the vertical direction; an inner tube extending in said vertical direction and provided so as to surround said boat laterally; an outer tube surrounding said inner tube laterally from outside, said outer tube further covering a top part of said inner rube; a flange holding said inner tube and outer tube at respective bottom ends thereof; gas introducing nozzles provided on a flange sidewall at two locations thereof, said gas introducing nozzles introducing gases from outside to an interior of said inner tube at respective gas ejection ports; and a gas evacuation part evacuating a gas in said outer tube to outside thereof;

wherein there is provided a guide part in the vicinity of said gas ejection ports of said gas introducing nozzles such that said gases ejected from said respective gas ejection ports are caused to flow generally parallel to a bottom surface of said flange along an inner surface of said flange sidewall, it becomes possible to supply the gases introduced from the two gas introducing nozzles to the surface of the substrates held on the boat after through mixing in the vicinity of the bottom of the flange. With this, improvement is attained with regard to the uniformity of film thickness and film quality for the films formed on the surface of the plural substrates placed on the boat. Further, because the thoroughly mixed gas is caused to flow along the inner surface of the flange sidewall with the action of the guide part, it becomes possible to supply the thoroughly mixed gas to the surface of the substrate held at the top part of the boat from the bottom part of the boat, and it becomes possible to achieve uniform film formation.

Further, by configuring the CVD apparatus such that the guide part includes two rectangular surfaces sharing respective edges with each other, such that one of the rectangular surfaces is disposed generally parallel to the inner surface of the sidewall, the other of the rectangular surfaces is disposed generally perpendicular to the inner surface of said sidewall, the construction of the guide part is simplified and it becomes possible to provide the guide part with low cost.

Further, by configuring the CVD apparatus such that the flange further comprises a projecting plate projecting from the inner surface of the flange sidewall in a direction toward a central part of the flange in a part thereof where at least the guide part is provided such that the projecting plate, a bottom surface of the flange inside the flange sidewall, the inner surface of the flange sidewall and the guide part form together a mixing space for mixing the gases, the mixed gas is caused to flow along the inner surface of said sidewall surface and it becomes possible to mix the two gases thoroughly. Thereby, it becomes possible to improve the in-plane uniformity of the film formed on the substrate surface in terms of film thickness and film quality.

Further, by using a holder holding the inner tube for projecting plate, there is no need of providing a dedicated projecting plate for forming the mixing space, and it becomes possible reduce the cost of the CVD apparatus.

Further, it becomes possible with the above-mentioned CVD apparatus to mix a silane family gas and an $N_2O$ gas thoroughly, and it becomes possible to improve the in-plane uniformity of the film formed by using a silane family gas and the $N_2O$ gas in terms of film thickness and film uniformity.

Further, by providing one of the gas introducing nozzles used for introducing the $N_2O$ gas to be located at an upstream side with regard to the other of the gas introducing nozzles used for introducing the silane family gas in the direction of the flow of the mixed gas along the inner surface of the flange sidewall, the silane family gas supplied with a small amount is mixed thoroughly with the $N_2O$ gas supplied with large amount as it is carried by the $N_2O$ gas, and mixing of the silane family gas and the $N_2O$ gas is facilitated further. With this, in-plane uniformity is improved further for the films formed on the surface of the substrates held on the boat.

According to the second aspect of this disclosure, in which the CVD apparatus comprises a vertical boat extending in a vertical direction and capable of holding plural substrates in a horizontal state such that said substrates are aligned in the vertical direction; an inner tube extending in said vertical direction and provided so as to surround said boat laterally; an outer tube surrounding said inner tube laterally from outside, said outer tube further covering a top part of said inner tube; a flange holding said inner tube and outer tube at respective bottom ends thereof; a gas introducing nozzle provided on a flange sidewall, said gas introducing nozzle introducing a gas from outside to an interior of said inner tube at a gas ejection port; a gas evacuation part evacuating a gas in said outer tube to outside thereof; a mixed gas supplying part provided outside said flange, said mixed gas supplying part comprising: two gas supplying paths respectively supplying different gases therethrough; a mixing part merging said two gas supplying paths with each other, said mixing part mixing said gases supplied from said respective gas supplying paths to form a mixed gas; and a single gas flow path supplying said mixed gas to one of said gas introducing nozzles connected thereto; and a guide part provided in the vicinity of said gas ejection port of said gas introducing nozzle such that said mixed gas ejected from said gas ejection port is caused to flow generally parallel to a bottom surface of said flange along an inner surface of said flange sidewall, the two gases are introduced into the CVD apparatus and reach the surface of the substrates held therein in the state that the two gases are mixed thoroughly already.

With this, it becomes possible to improve the in-plane uniformity of the film formed on the surface of the substrates in terms of film thickness and film quality.

Further, because the mixed gas introduced into the apparatus forms a flow at the bottom of the flange along the inner surface of the flange sidewall with the action of the guide part, it becomes possible to supply the thoroughly mixed gas to the surface of the substrate held on the top part of the boat from the bottom of the boat, and it becomes possible to achieve uniform film formation.

In the foregoing second aspect too, the construction of the guide part is simplified and it becomes possible to provide the guide part with low cost, by configuring the CVD apparatus such that the guide part includes two rectangular surfaces sharing respective edges with each other, one of the rectangular surfaces being disposed generally parallel to the inner surface of the sidewall, the other of the rectangular surfaces being disposed generally perpendicular to the inner surface of said sidewall.

Further, with the second aspect, too, it becomes possible to mix the two gases thoroughly and achieve uniform film formation by supplying the thoroughly mixed gas to the surface of the substrate held on the top part of the boat from the bottom of the boat, by configuring the CVD apparatus such that the flange further comprises a projecting plate projecting from the inner surface of the sidewall in a direction toward a center of the flange in a part thereof where at least the guide part is provided, and such that the projecting plate, a bottom surface of the flange inside the sidewall, the inner surface of the sidewall and the guide part form together a mixing space for mixing the gases to form a mixed gas, the mixing space further causing to flow the mixed gas along the inner surface of said sidewall surface.

Further, by using a holder holding the inner tube for projecting plate, there is no need of providing a dedicated projecting plate for forming the mixing space, and it becomes possible reduce the cost of the CVD apparatus.

Further, it is possible to form the guide part also easily and with low cost by forming the guide part such that the guide part comprises a conduit connected to the gas ejection port of the gas introducing nozzle and cause the conduit to discharge the mixed gas in the direction generally parallel to the bottom surface of the flange along the inner surface of the sidewall.

Further, by using a silane family gas and the $N_2O$ gas for the two gases, it becomes possible to cause through mixing in these gases, which has been difficult to achieve with the conventional CVD apparatus. Thus, it becomes possible to improve the in-plane uniformity for the film formed on the substrate surface by using these gases in terms of film thickness and film quality.

BRIEF DESCRIPTION OF THE DRAWINGS

FIG. 2 is an enlarged oblique view diagram showing an example of a guide part;

DETAILED DESCRIPTION OF THE PREFERRED EMBODIMENT

Figure 1A:
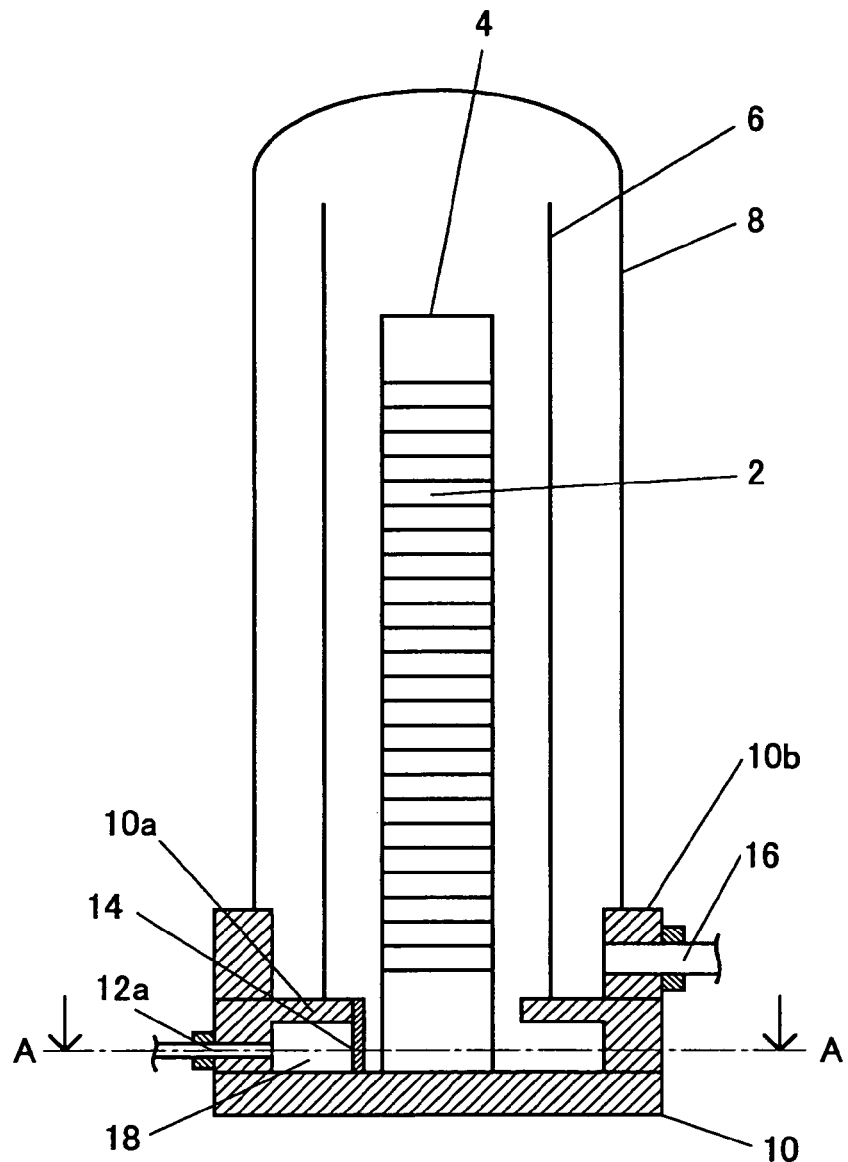
FIGS. 1A and 1B are diagrams showing the construction of a CVD apparatus according to an embodiment of the present invention respectively in an overall cross-sectional view and an enlarged cross-sectional view taken along a line A-A' of FIG. 1A.
Figure 1B:
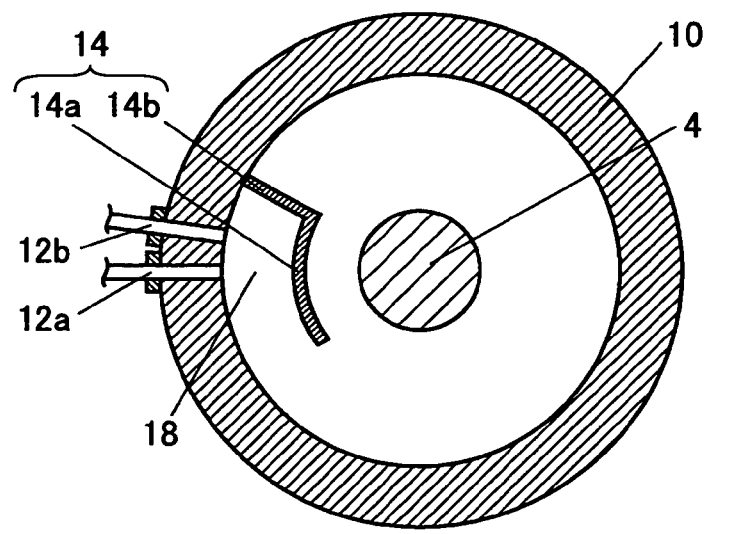

Hereinafter, the present invention will be described with reference to FIGS. 1A and 1B showing the construction of a CVD apparatus according to a preferred embodiment of the present invention, wherein FIG. 1A shows the CVD apparatus in an overall cross-sectional view while FIG. 1B shows the CVD apparatus in an enlarged cross-sectional view taken along a line A-A' of FIG. 1A.

Referring to FIGS. 1A and 1B, the CVD apparatus includes a boat 4 at a central part thereof for holding substrates 2 on which film formation is to be made, wherein the substrates 2 may be a semiconductor substrate. The boat 4 is formed of a quartz glass, for example, and holds therein fifty substrates 2 from the bottom part thereof to the top part thereof in a manner that each substrate 2 is laid horizontally.

Further, there is disposed a flange 10 of circular cross-sectional shape below the boat 4 wherein the bottom part of the boat 4 is supported by the flange 10.

Surrounding the boat 4, there is disposed an inner tube 6 in a manner supported by an inner tube holding part 10a formed on the flange 10. The inner tube holding part 10a is a doughnut-shaped circular plate member projecting from the sidewall of the flange 10 toward a central part thereof, wherein inner tube holding part 10a is formed with a separation from the bottom surface of the flange 10.

Further, surrounding the inner tube 6, there is provided an outer tube 8 of cylindrical form such that the outer tube 8 surrounds the inner tube 6 with a separation therefrom, wherein the outer tube 8 is held by an outer tube holding part 10b of the flange 10 formed at a level higher than the inner tube holding part 10a with reference to the bottom surface of the flange 10.

In order to introduce gases of two kinds, such as a silane family gas and an $N_2O$ gas, the flange 10 is provided with two gas introducing nozzles 12a and 12b on a sidewall thereof between the flange bottom surface and the inner tube holding part 10a, wherein the two gas introducing nozzles 12a and 12b are formed at the same level with reference to the bottom surface of the flange 10. Thereby, the gas introducing nozzles 12a and 12b eject respective gases toward the central part of the flange 10.

Further, with the CVD apparatus of the present embodiment, there is disposed a guide part 14 between the bottom surface and the inner tube holding part 10a of the flange 10 in the vicinity of the gas ejection ports of the gas introducing nozzles 12a and 12b.

More specifically, the guide part 14 is provided such that the upper edge thereof makes a contact with the bottom surface of the inner tube holding part 10a and the bottom edge of the guide part 14 makes a contact with the bottom surface of the flange 10.

The guide part 14 is formed of two rectangular surfaces 14a and 14b sharing an edge with each other, wherein the rectangular surface 14a is formed generally perpendicular to the direction of gas ejection of the gas introducing nozzles 12a and 12b with a distance of about 40 mm from the sidewall of the flange 10 or flange sidewall so as to deflect the flow of the gases introduced from the gas introducing nozzles 12a and 12b.

The rectangular surface 14a is curved along the inner surface of the flange sidewall while the rectangular surface 14b is provided generally perpendicular to the inner surface of the flange sidewall in a manner fixed to the flange sidewall at the side of the gas introducing nozzle 12b.

With this embodiment, the guide part 14 is formed by bending a stainless steel plate of the thickness of 2 mm in a generally L-shaped form. By using such a generally L-shaped plate member, it is possible to provide the guide part 14 simply with low cost.

Further, the gas exhaust part 16 is provided on the flange sidewall at a level higher than the inner tube holding part 10a with reference to the bottom surface of the flange 10. The gas exhaust part 16 is connected to a pump (not illustrated) and the gas inside the outer tube 8 is evacuated by the pump. Further, by driving the pump, the space inside the outer tube 8 (the space inside the CVD apparatus) is held to a low pressure state.

With this embodiment, the guide part 14 is disposed such that the rectangular surface 14a makes a contact with the innermost edge surface of the inner tube holding part 10a as shown in FIG. 2, while the rectangular surface 14b, formed with a smaller height as compared with the rectangular surface 14a, is inserted between the lower surface of the inner tube holding part 10a and the bottom surface of the flange 10. Thus, there is formed a space 18 in the vicinity of the gas ejection ports of the gas introducing nozzles 12 and 12b in the manner surrounded by the bottom surface of the flange 10, the flange sidewall and the rectangular surfaces 14a and 14b of the guide part 14.

With this, the two gases respectively introduced from the gas introducing nozzles 12a and 12b are mixed thoroughly in the space 18 and the resultant mixed gas is caused to flow along the inner surface of the flange sidewall after being ejected generally in the horizontal direction.

Because the rectangular surface 14b of the guide part 14 is formed generally perpendicular to the sidewall inner surface of the flange 10, the gases introduced from the gas introducing nozzles 12a and 12b can flow only in one direction (anticlockwise direction in the illustrated example).

With reference to the direction of the gas flow thus formed along the sidewall surface of the flange 10, the gas introducing nozzle 12b is located at an upstream side while the gas introducing nozzle 12a is located at a downstream side of the gas introducing nozzle 12b.

With such a CVD apparatus that uses two gases, the one being introduced at an upstream side in terms of the gas flow direction and the other being introduced at a downstream side, it is preferable to introduce the gas of smaller flow rate from the gas introducing nozzle 12a and to introduce the gas of larger flow rate from the gas introducing nozzle 12b in the event the first gas is introduced with larger flow rate as compared with the other gas. Thereby, the gas introduced from the gas introducing nozzle 12a of the downstream side with small flow rate is carried by the gas introduced from the gas introducing nozzle 12b at the upstream side with large flow rate, these two gases are mixed efficiently and thoroughly as the gas from the nozzle 12a is carried by the gas from the nozzle 12b.

In the case of using a silane family gas with an $N_2O$ gas, it is generally accepted that use of the mixing ratio of 1:40-1:60 is preferable for the silane family gas and the $N_2O$ gas (silane family gas: $N_2O$ gas) in terms of the flow rate. Thus, with this embodiment, the $SiH_4$ gas is introduced from the gas introducing nozzle 12a and the $N_2O$ gas from the gas introducing nozzle 12b in such a manner that the $SiH_4$ gas is mixed with 25 cc/m and the $N_2O$ gas with 1225 cc/m.

Further, while not illustrated, the CVD apparatus includes, in addition to the structure explained above, other mechanisms such as a port elevator that pulls down the heater heating the interior of the apparatus and the boat 4 for enabling taking out or loading of the substrates 2.

Next, the operation of the CVD apparatus of the foregoing embodiment will be described.

With this embodiment, the heaters are used to heat the boat 4 such that the boat 4 shows the temperature of 823° C., 803° C., 798° C. and 793° C. at four measuring points defined from the top part to the bottom part of the boat 4 with an equal distance. Further, the pressure inside the apparatus is set to 0.1 kPa by using the pump.

Further, a $SiH_4$ gas and a $N_2O$ gas are used for the two gases, and thus, the $SiH_4$ gas is introduced from the gas introducing nozzle 12a while the $N_2O$ gas is introduced from the gas introducing nozzle 12b.

Thus, the $SiH_4$ gas and the $N_2O$ gas are introduced into the CVD apparatus respectively from the gas introducing nozzles 12a and 12b via the flange 10.

Thereby, the respective gases thus ejected from the gas ejection ports of the gas introducing nozzles 12a and 12b are mixed thoroughly in the space formed by the guide part 14, and the like, and the mixed gas formed as a result of mixing of the $SiH_4$ gas and the $N_2O$ gas is caused to flow along the inner surface of the flange sidewall. Thereafter, the mixed gas is flows in the inner tube 6 in the upward direction. After reaching the top part of the outer tube 8, the mixed gas flows to the gas evacuation part 16 through the space between the outer tube 8 and the inner tube 6 and is discharged to the outside of the apparatus by the pump.

As explained above, the CVD apparatus can mix the two gases ejected from the respective, different nozzles 12a and 12b thoroughly by forming the space 18 in the vicinity of the respective gas ejection ports of the gas introducing nozzles 12a and 12b, and it is possible to improve the in-plane uniformity of the film formed by using these gases.

Because of the shape of the guide 14 forming the space 18, the mixed gas is ejected generally horizontally from the space 18 and flows along the inner surface of the flange sidewall at the bottom of the flange 10. With this, a thoroughly mixed gas is supplied from the bottom part to the top part of the boat 4, and it becomes possible to form a uniform film on the surface of the plural substrates 2 held in the boat 4 in the manner aligned from the bottom part thereof to the top part thereof.

Figure 3:
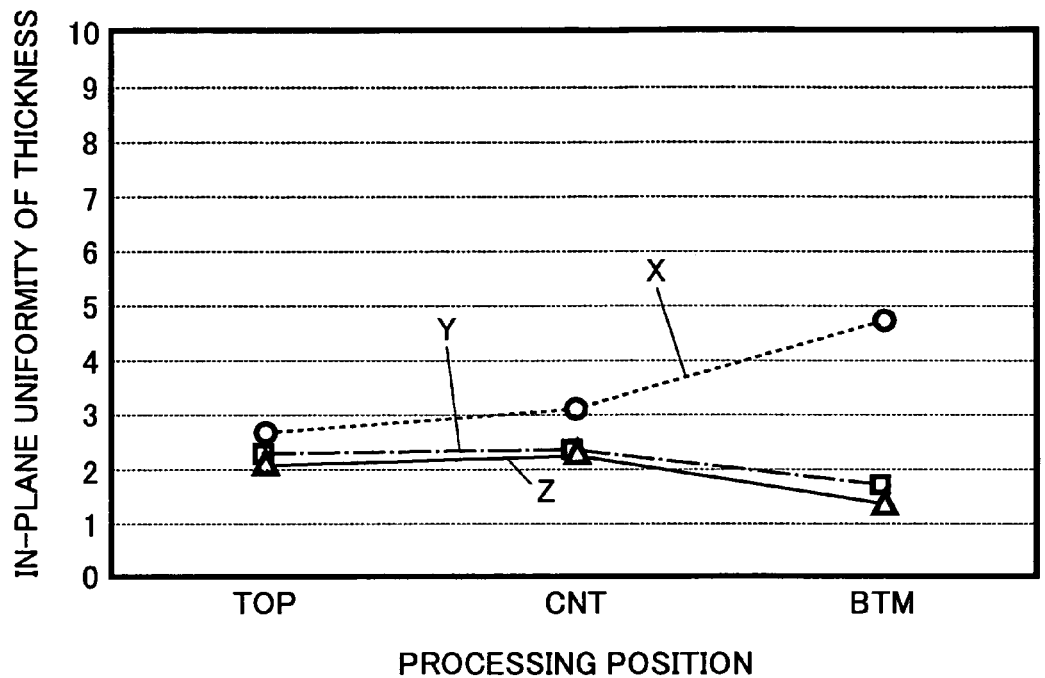
FIG. 3 is a graph showing the relationship between the location of the substrate in a boat and the in-plane uniformity of the film formed on such a substrate.
Figure 4:
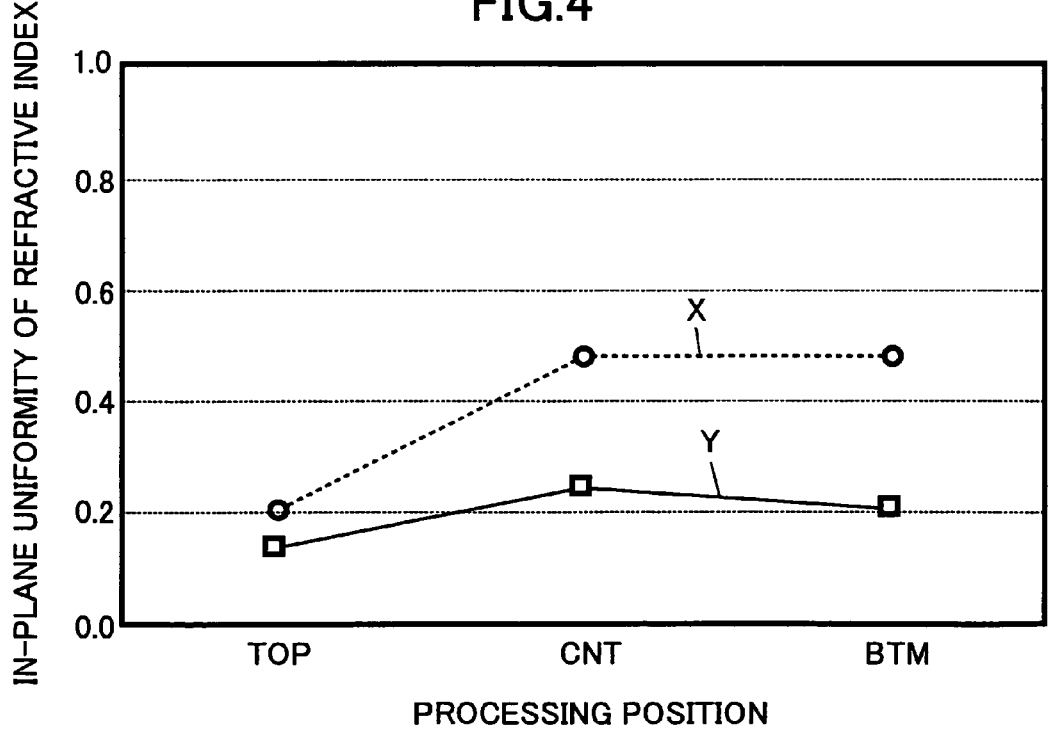
FIG. 4 is a graph showing the relationship between the location of the substrate in a boat and the refractive index of the film formed on such a substrate.

FIGS. 3 and 4 are graphs showing the relationship between the height of the substrate in the boat (processing height) and the in-plane uniformity of the film formed on the substrate surface, wherein FIG. 3 shows the in-plane uniformity of the film thickness while FIG. 4 shows the in-plane uniformity of the refractive index of the case of irradiating a light to the film. In FIG. 3, it should be noted that horizontal axis represents the processing position of the substrate to be measured (height in the boat), wherein it should be noted that TOP represents the top part of the boat, CNT represents the center of the boat, and BTM represents the bottom of the boat bottom. On the other hand, the vertical axis represents the in-plane uniformity (%) of the film formed on the surface of the semiconductor substrate. Further, in FIG. 4, the horizontal axis represents the processing position of the substrate to be measured while the vertical axis represents the in-plane uniformity (%) of the refractive index of the film formed on the surface of the semiconductor substrate.

In FIG. 3, it should be noted that the data (X) represented by the broken line represents in-plane uniformity of film thickness of the film formed in the vicinity of the nozzle 12 without forming the guide part 14, the data (Y) represented by the one-dotted line represents in-plane uniformity of film thickness of the film for the case the guide part 14 is disposed in the vicinity of the nozzle 12 and film formation is conducted by introducing the $SiH_4$ gas from the upstream side nozzle 12b, while the data (Z) represented by the continuous line represents in-plane uniformity of film thickness of the film formed by disposing the guide part 14 in the vicinity of the nozzle 12 and introducing the $SiH_4$ gas from the nozzle 12a at the downstream side similarly to the case of the CVD apparatus of FIGS. 1 and 2.

In FIG. 4, the data (X) represented by the broken line represents in-plane uniformity of refractive index of the film formed in the vicinity of the nozzle 12 for the case not forming the guide part 14, while the data (Y) represented by the continuous line represents in-plane uniformity of refractive index of the film formed by disposing the guide part 14 in the vicinity of the nozzle 12 and introducing the $SiH_4$ gas from the nozzle 12a at the downstream side similarly to the case of the CVD apparatus of FIGS. 1 and 2.

Here, it should be noted that the in-plane uniformity $A_1$(%) for the film thickness and the in-plane uniformity $A_2$(%) for the refractive index of FIGS. 3 and 4 are calculated according to Equations (1) and (2) below:

$$A_1 = (\text{maximum film thickness} - \text{minimum film thickness})/2/\text{average in-plane film thickness} \times 100 \quad (1)$$

$$A_2 = (\text{maximum refractive index} - \text{minimum refractive index})/2/\text{average in-plane refractive index} \times 100 \quad (2)$$

Thereby, it should be noted that the refractive index shown in FIG. 4 for the case of irradiating optical radiation to the film represents the film quality, and thus, it is indicated that a film of more uniform film quality is obtained when the in-plane variation of the refractive index has become smaller.

From FIGS. 3 and 4, it can be seen that the in-plane uniformity is improved for the film formed on the substrate with regard to the film thickness and film quality by disposing the guide part 14 in the vicinity of the gas ejection ports of the gas introducing nozzles 12a and 12b. This effect of improvement appears most conspicuously in the substrates held in the bottom part of the boat 4. Further, as shown in FIG. 3, it can be seen that the in-plane uniformity of the film thickness is improved by about 0.3% for the film formed on the substrate surface by introducing the $SiH_4$ gas from the gas introducing nozzle 12a at the downstream side and by introducing the $N_2O$ gas from the upstream side.

Because the present embodiment uses only the L-shaped stainless steel plate for the guide part 14 and forms the space for mixing the two gases by using the inner tube holding part 10a, it becomes possible to build a CVD apparatus capable of supplying the two gases to the surface of the substrates in the thoroughly mixed state.

Further, it should be noted that, while the present embodiment forms the space 18 by using the bottom surface and sidewall surface of the flange 10, the inner tube holding part 10a and the guide part 14, the CVD apparatus of the present invention is not limited to such a specific construction but it is also possible to form the space 18 by forming a projecting plate different from the inner tube holding part 10a on the inner wall surface of the flange 10 so as to define the sidewall surface of the space 18. In this case, the inner tube holding part 10a is not used for the wall of the space 18. Further, it is also possible to form the sidewall surface of the space 18 without providing the inner tube holding part 10a or providing a member that replaces the inner tube holding part 10a.

This applies also to the embodiments explained later with reference to FIG. 7.

Figure 5A:
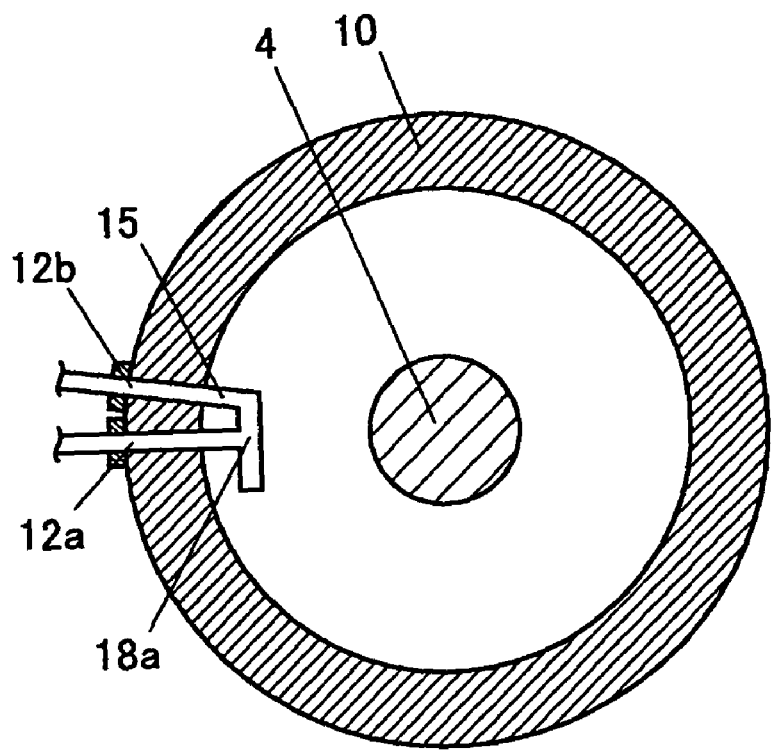
FIGS. 5A and 5B are cross-sectional diagrams showing another embodiment of the CVD apparatus of the present invention.

In the case of not using the L-shaped stainless steel plate for the guide part 14, it is also possible to provide a conduit member 15 connected to the gas ejection ports of the gas introducing nozzles 12a and 12b to in place of the guide part of the present invention as shown in FIG. 5A such that the conduit 15 merges the gas introducing nozzles 12a and 12b and ejects the mixed gas in the generally horizontal direction along the inner surface of the flange sidewall. In this case, the interior of the conduit 15 serves for the space 18a for mixing two different gases.

In the case of using the conduit member 15 for the guide part, the two gases of different kinds respectively introduced from the gas introducing nozzles 12a and 12b are ejected generally in the horizontal direction along the sidewall inner surface of the flange 10 after being thoroughly mixed in the space 18a inside the conduit member 15, it becomes possible to supply the thoroughly mixed gas to the surface of the substrates 2 disposed in the boat 4 from the bottom part thereof to the top part thereof, and it becomes possible to form a film of excellent in-plane uniformity on the surface of the substrate 2.

Figure 5B:
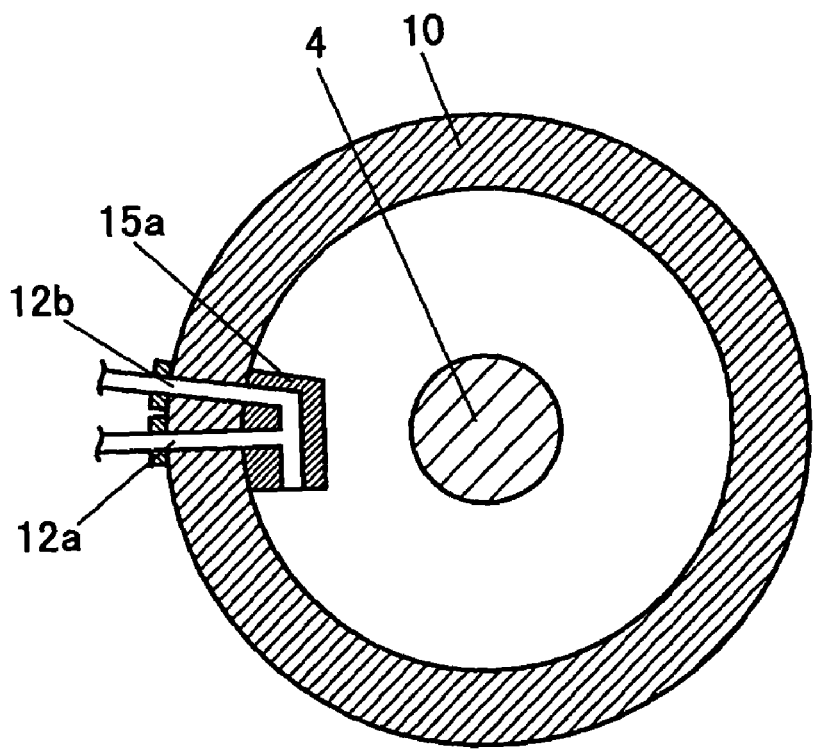

Further, it is possible to use, in place of the conduit member 15, a conduit block 15a shown in FIG. 5B, in which the gas introducing nozzles 12a and 12b are merged inside and includes a flow path for ejecting the mixed gas of the two gases in the generally horizontal direction along the inner wall surface of the flange 10. In this case, too, it is possible to attain the effect similar to the one obtained by using the conduit member 15.

In any of the cases of using the conduit member 15 and the conduit block 15a, the in-plane uniformity of the film formed on the substrates 2 is improved further by introducing the $N_2O$ gas from the gas introducing nozzle 12b at the upstream side and by introducing the silane family gas from the gas introducing nozzle 12a of the downstream side similarly to the case of FIGS. 1A and 1B that uses the guide part 14 of FIG. 2, because of the further improved efficiency of mixing these two gases.

While the embodiment explained above shows the construction of the CVD apparatus in which the two gases are introduced from two gas introducing nozzles 12a and 12b at two locations and the two gases are mixed with each other in the vicinity of the gas introducing nozzles 12a and 12b, it is also possible that the CVD apparatus of the present invention introduces the two gases into the apparatus after mixing in advance. Hereinafter, such an embodiment will be described.

Figure 6A:
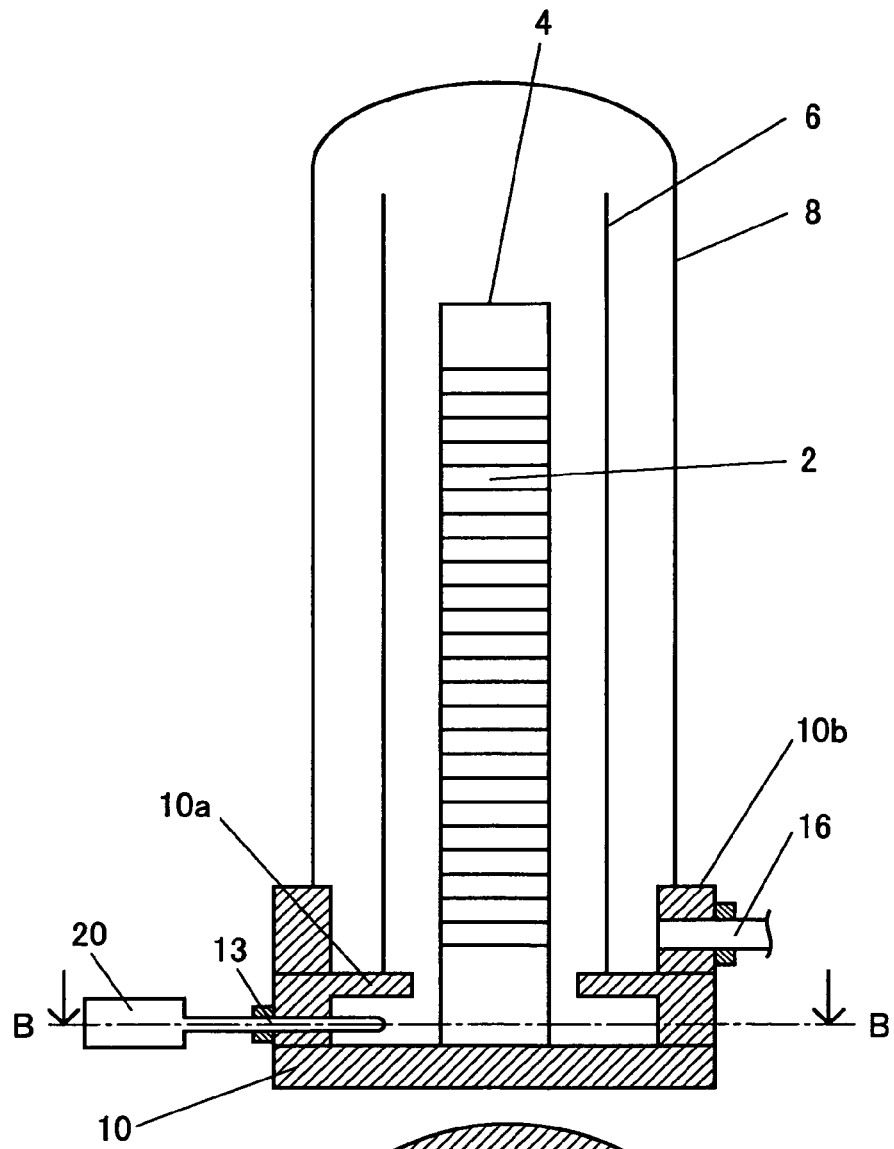
FIGS. 6A and 6B are cross-sectional diagrams showing a further embodiment of the CVD apparatus of the present invention.
Figure 6B:
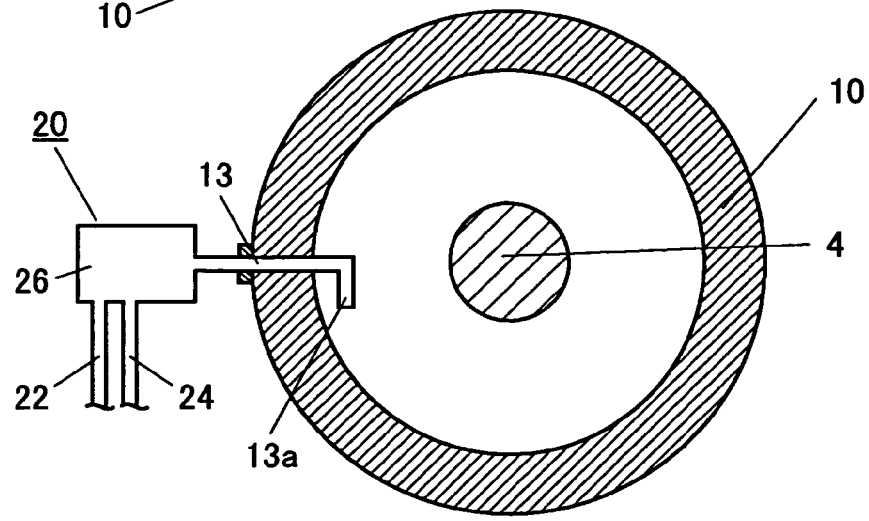

FIGS. 6A and 6B show the construction of a CVD apparatus according to another embodiment of the present invention, wherein FIG. 6A shows the overall cross-sectional view while FIG. 6B is an enlarged cross-sectional view taken along a B-B' line of FIG. 6A.

Referring to FIGS. 6A and 6B, the CVD apparatus includes a single gas introducing nozzle in one part of the sidewall surface of the flange 10, wherein it will be noted that the gas introducing nozzle 13 includes a gas ejection port 13a bent in an L-shaped form in the region inside the flange 10. Thus the gas ejection part 13a ejects the gas along the sidewall inner surface of the flange 10 generally in a horizontal direction.

To the gas introducing nozzle 13, there is connected a mixed gas supplying part 20 from outside such that the mixed gas supplying part 20 can supply a mixed gas containing the silane family gas and the N2O gas with a proportion of 1:50.

The mixed gas supplying part comprises a mixing part 26 that merges other the gas supply paths 22 and 24 respectively supplying the silane family gas and the $N_2O$ gas and mixes the gases supplied from the gas supply paths 22 and 24, wherein the mixing part 26 is connected to a gas introducing nozzle 13.

Thus, with the CVD apparatus of the present embodiment, the mixed gas mixed thoroughly in the mixing part 26 of the mixed gas supplying part 20 is ejected generally horizontally along the sidewall inner surface of the flange 10, and it becomes possible to form a uniform film on the surface of the substrates held in the boat 4, similarly to the CVD apparatus explained with reference to FIGS. 1A and 1B that uses the guide part 14 of FIG. 2.

Further, while the illustrated example uses an L-shaped conduit for the ejection port 13a, it is also possible to use a conduit block similar to the one shown in FIG. 5B in place of the conduit.

Figure 7:
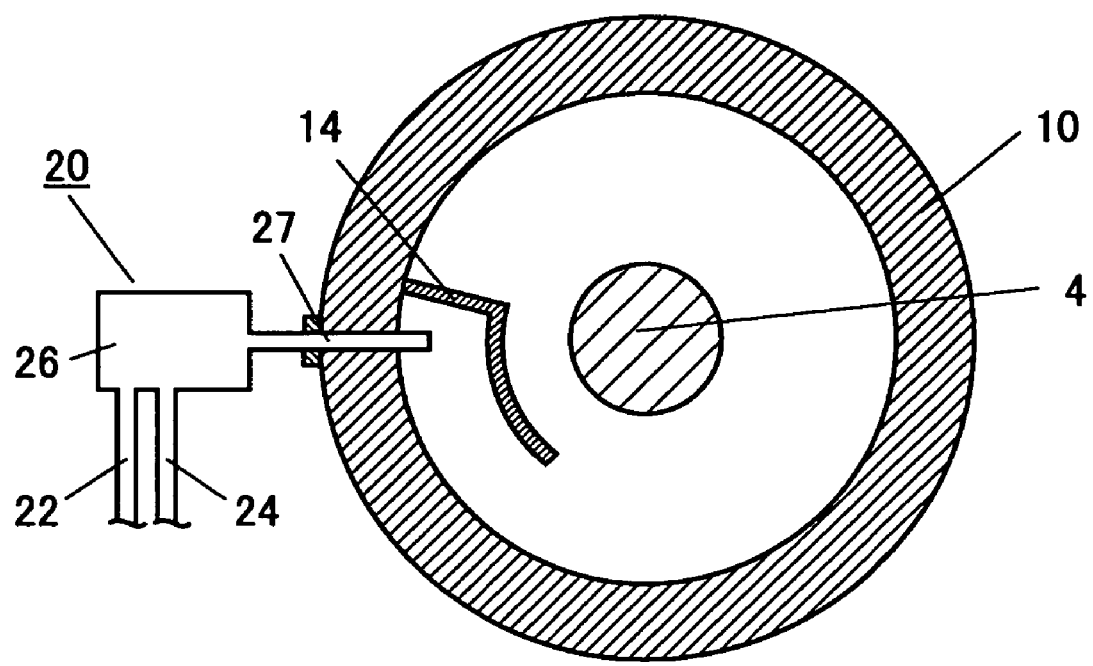
FIG. 7 is a cross-sectional diagram showing another embodiment of the CVD apparatus of the present invention.
Figure 8A:
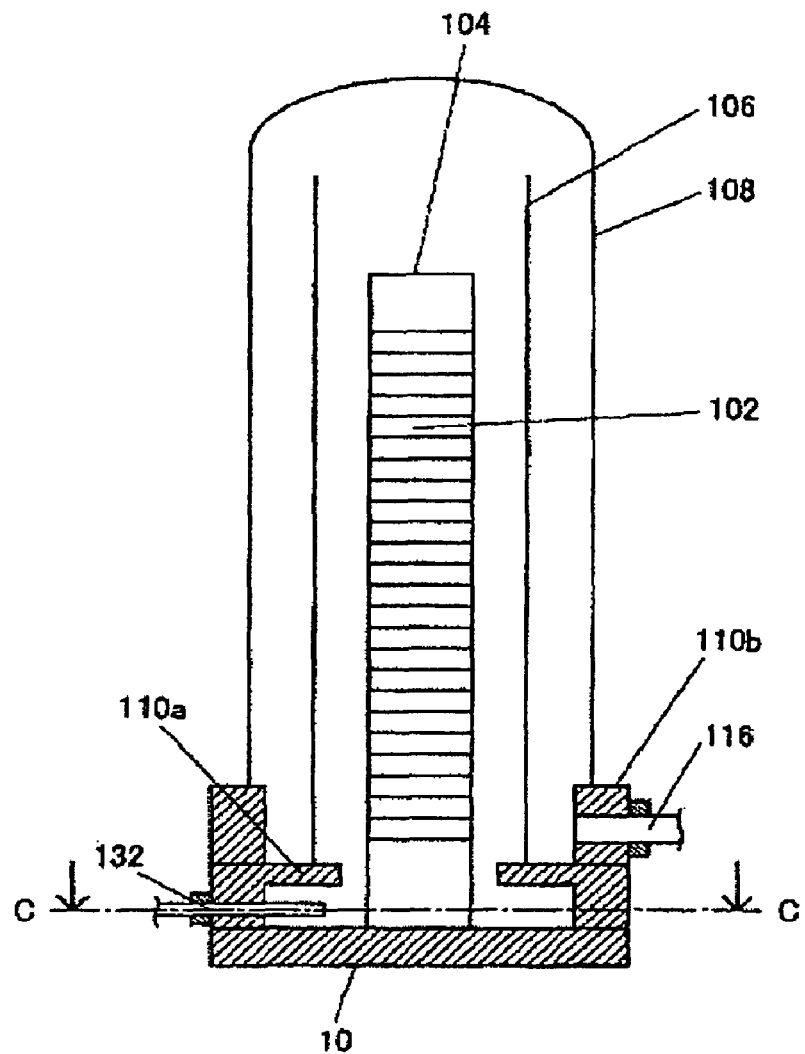
FIGS. 8A and 8B are cross-sectional diagrams showing an example of a CVD apparatus according to a related art of the present invention.
Figure 8B:
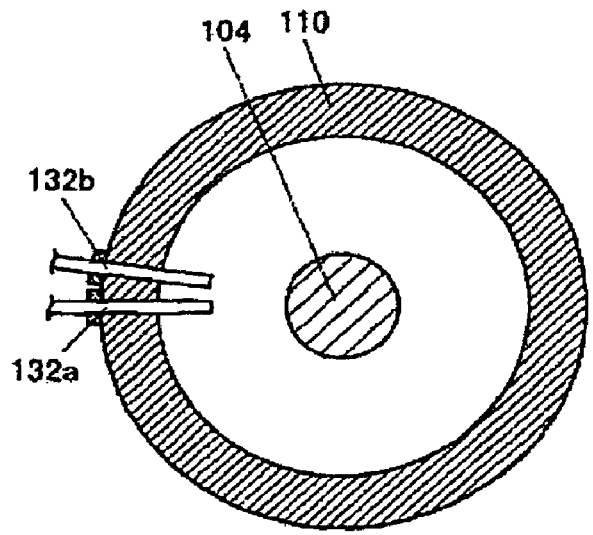
Figure 9:
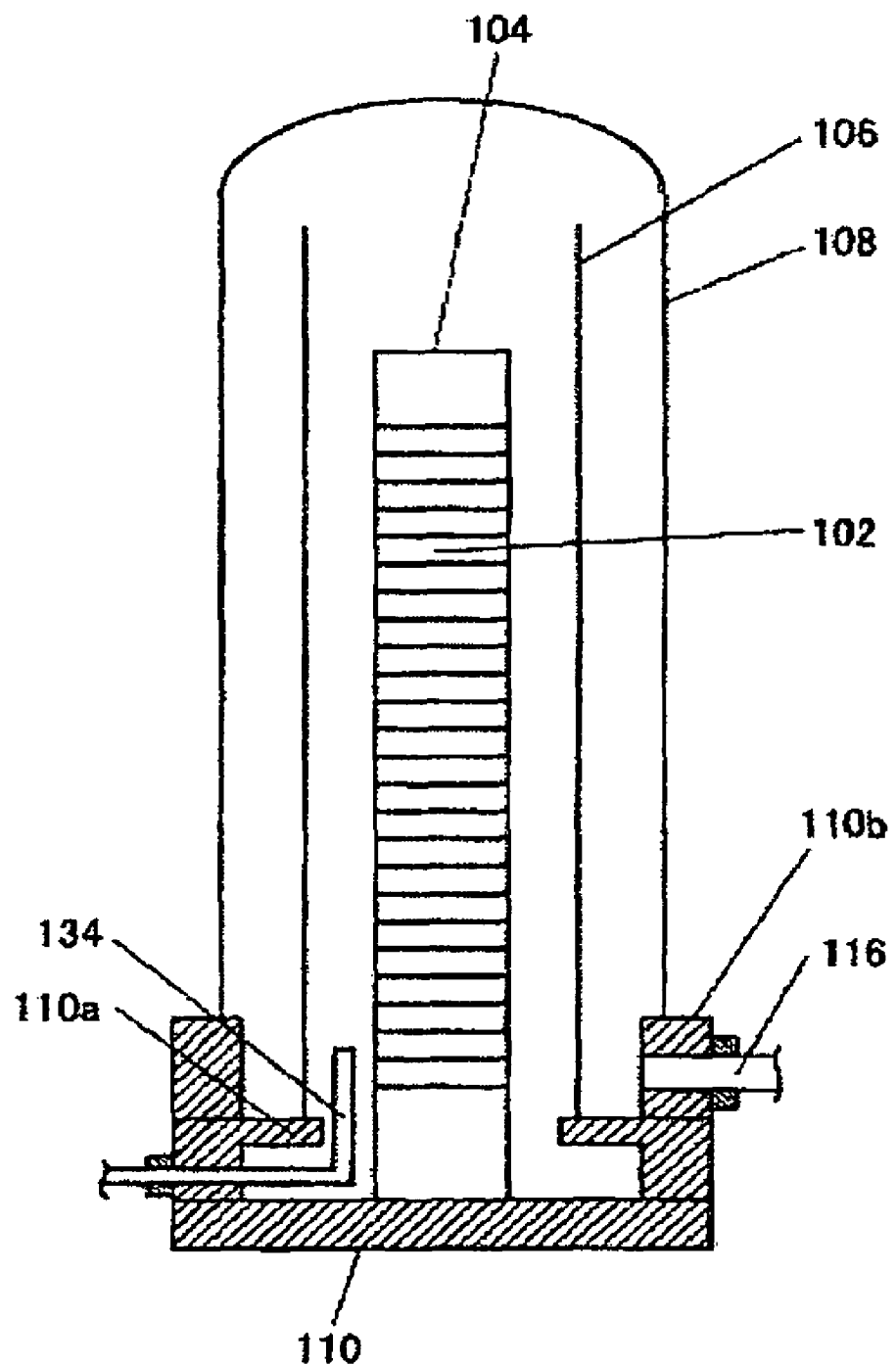
FIG. 9 is a cross-sectional diagram showing another example of a CVD apparatus according to a related art of the present invention.

Further, as shown in FIG. 7, it is also possible to connect a nozzle 27 to the mixed gas supplying part 20 so as to eject the mixed gas toward the central part of the flange 10 similarly to the embodiment of FIGS. 1A and 1B that uses the guide part 14 of FIG. 2. With the construction of FIG. 7, the guide part 14 is disposed in the vicinity of the gas ejection port of the nozzle 27 and the mixed gas introduced from the gas introducing nozzle 27 is caused to flow along the sidewall inner surface of the flange 10 similarly to the embodiment of FIGS. 1A and 1B.

Further, while the present invention is described heretofore for preferred embodiments of the CVD apparatus, the present invention is by no means limited to such embodiments and various variations and modifications may be made within the scope of the invention in terms of size, shape, arrangement, material, and the like.

The present invention is based on Japanese priority application No. 2005-267892 filed on Sep. 15, 2005, the entire contents of which are incorporated herein as reference.

What is claimed is:

1. A CVD apparatus, comprising:
 a vertical boat extending in a vertical direction and configured to hold plural substrates in a horizontal state such that said substrates are aligned in the vertical direction;
 an inner tube extending in said vertical direction and configured to surround said boat laterally;
 an outer tube surrounding said inner tube laterally from outside, said outer tube further covering a top part of said inner tube;
 a flange holding said inner tube and outer tube at respective bottom ends thereof;
 a plurality of gas introducing nozzles provided on a flange outer sidewall;
 a plurality of gas ejection ports connected to respective ones of the gas introducing nozzles and configured to introduce gases from said respective gas introducing nozzles to a mixing space for mixing said gases to form a mixed gas, said mixing space being within the interior of said flange and open to an interior of said inner tube; and
 a gas evacuation part evacuating a gas in said outer tube to outside thereof;
 wherein said mixing space is bounded by an inner surface of the flange sidewall, by a bottom surface of the flange and by a guide part on the bottom surface of the flange, such that said gases introduced to said mixing space by said plurality of gas ejection ports are caused to flow as said mixed gas generally parallel to the bottom surface of said flange along the inner surface of said flange sidewall and along a rotary path, said mixed gas being further caused to flow in said inner tube in an upward direction,
 wherein said guide part includes two rectangular surfaces sharing respective edges with each other, one of said rectangular surfaces being disposed generally concentric with said inner surface of said flange sidewall, the other of said rectangular surfaces being disposed generally perpendicular to said inner surface of said flange sidewall,
 wherein said flange further comprises a projecting plate projecting from said inner surface of said flange sidewall in a direction toward a center of said flange in a part thereof where at least said guide part is formed, said projecting plate, a bottom surface of said flange inside said sidewall, said inner surface of said flange sidewall and said guide part together bound said mixing space for mixing said gases to form a mixed gas, said mixing space further causing to flow said mixed gas along said inner surface of said flange sidewall.

2. The CVD apparatus as claimed in claim 1, wherein said projecting plate forms a holder holding said inner tube.

3. The CVD apparatus as claimed in claim 1, wherein said guide part comprises a conduit connected to respective gas ejection ports, said conduit being configured to mix said gases introduced from said respective gas ejection ports with each other to form said mixed gas and discharging said mixed gas in said direction generally parallel to said bottom surface of said flange along said inner surface of said flange sidewall.

4. The CVD apparatus as claimed in claim 1, wherein said gas introducing nozzles introduce a silane family gas and an $N_2O$ gas to said gas ejection ports respectively.

5. The CVD apparatus as claimed in claim 4, wherein said gas ejection ports introduce said silane family and said $N_2O$ gas at a same height as measured from a bottom surface of said flange, one of said gas ejection ports being located at an upstream side with regard to the other of said gas ejection ports in a direction of a flow of said mixed gas formed along said inner surface of said flange sidewall, being used to introduce said $N_2O$ gas, said the other of said gas ejection ports being used to introduce said silane family gas.

6. The CVD apparatus as claimed in claim 4, wherein said $N_2O$ gas is introduced at a larger flow rate and said silane family gas is introduced at a smaller flow rate, a ratio of said smaller flow rate to said larger flow rate being 1:40 to 1:60.

7. The CVD apparatus of claim 1, wherein said apparatus comprises two gas introducing nozzles and two respective gas ejection ports.

8. The CVD apparatus of claim 1, wherein said gas ejection ports are configured to introduce said gases to said mixing space in a radial direction of said inner tube.

9. The CVD apparatus of claim 1, wherein said guide part is configured to cause said gases to flow in a direction perpendicular to a radial direction of said inner tube.

10. The CVD apparatus of claim 1, wherein said gas ejection ports introduce said gases near said bottom end of said inner tube.

11. The CVD apparatus of claim 1, wherein said guide part is formed from a single piece of stainless steel.

12. The CVD apparatus of claim 1, wherein said rectangular surface of said guide part being disposed generally concentric with said inner surface of said flange sidewall is disposed at a distance of about 40 mm from said inner surface of said flange sidewall.

13. The CVD apparatus as claimed in claim 1, wherein said gas ejection ports introduce one of said gases at a larger flow rate and another of said gases at a smaller flow rate, and introduce both at a same height as measured from a bottom surface of said flange, one of said gas ejection ports being located at an upstream side with regard to the other of said gas ejection ports in a direction of a flow of said mixed gas formed along said inner surface of said flange sidewall, being used to introduce said one of said gases at a larger flow rate, said the other of said gas ejection ports being used to introduce said another of said gases at a smaller flow rate.

* * * * *